US012736563B2

(12) United States Patent
Lee et al.

(10) Patent No.: US 12,736,563 B2
(45) Date of Patent: Sep. 15, 2026

(54) DISPLAY PANEL INSPECTION DEVICE AND DISPLAY PANEL INSPECTION METHOD USING THE SAME

(71) Applicant: Samsung Display Co., LTD., Yongin-si (KR)

(72) Inventors: Dong Hoon Lee, Yongin-si (KR); Haewook Yang, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 406 days.

(21) Appl. No.: 18/466,017

(22) Filed: Sep. 13, 2023

(65) Prior Publication Data

US 2024/0219424 A1 Jul. 4, 2024

(30) Foreign Application Priority Data

Dec. 30, 2022 (KR) ........................ 10-2022-0190864

(51) Int. Cl.
*G01R 1/073* (2006.01)

(52) U.S. Cl.
CPC .................................... *G01R 1/073* (2013.01)

(58) Field of Classification Search
USPC ..................................................... 324/755.01
See application file for complete search history.

(56) References Cited

U.S. PATENT DOCUMENTS 6,577,145 B2 * 6/2003 Okuno ............... G01R 1/07364
324/756.03

FOREIGN PATENT DOCUMENTS

| | | |
|---|---|---|
| KR | 10-0747653 | 8/2007 |
| KR | 10-2015-0062414 | 6/2015 |
| KR | 10-2015-0066018 | 6/2015 |
| KR | 10-1980849 | 5/2019 |
| KR | 10-2150940 | 9/2020 |

* cited by examiner

*Primary Examiner* — Farhana A Hoque
(74) *Attorney, Agent, or Firm* — CANTOR COLBURN LLP

(57) ABSTRACT

A display panel inspection device includes a body part extending in a first direction, at least one guide rail disposed on a part of the body part and extending in the first direction, a plurality of probe blocks connected to the at least one guide rail, movable along the at least one guide rail, and arranged in the first direction, and at least one transfer robot connected to one probe block among the plurality of probe blocks and movable in the first direction and a second direction opposite to the first direction.

20 Claims, 6 Drawing Sheets

DISPLAY PANEL INSPECTION DEVICE AND DISPLAY PANEL INSPECTION METHOD USING THE SAME

CROSS-REFERENCE TO RELATED APPLICATION(S)

This application claims priority to and benefits of Korean Patent Application No. 10-2022-0190864 under 35 U.S.C. § 119, filed on Dec. 30, 2022, in the Korean Intellectual Property Office (KIPO), the entire disclosure of which is incorporated herein by reference.

BACKGROUND

1. Technical Field

Embodiments relate to a display panel inspection device. More specifically, embodiments relate to a display panel inspection device and a display panel inspection method using the same.

2. Description of the Related Art

A flat panel display device is used as a display device replacing a cathode ray tube display device due to characteristics such as light weight, thin shape, and the like. Representative examples of the flat panel display device include a liquid crystal display device and an organic light emitting display device.

A display device may include a display panel that displays an image. An inspection process may be performed to check whether the display panel is normally driven. This inspection process may be performed by checking whether the display panel is normally driven by providing an electrical signal to the display panel from an inspection device.

SUMMARY

Embodiments provide a display panel inspection device with improved inspection efficiency.

Embodiments provide a display panel inspection method using the display panel inspection device.

A display panel inspection device according to an embodiment of the disclosure includes a body part extending in a first direction, at least one guide rail disposed on a part of the body part and extending in the first direction, a plurality of probe blocks connected to the at least one guide rail, movable along the at least one guide rail, and arranged in the first direction, and at least one transfer robot connected to one probe block among the plurality of probe blocks and movable in the first direction and a second direction opposite to the first direction.

In an embodiment, each of the plurality of probe blocks may include a first clamp. Each of the plurality of probe blocks may be connected to the at least one transfer robot through the first clamp.

In an embodiment, each of the plurality of probe blocks may further include at least one second clamp. Each of the plurality of probe blocks may be fixed to the at least one guide rail through the at least one second clamp.

In an embodiment, each of the plurality of probe blocks may further include at least one rail coupling part. Each of the plurality of probe blocks may be connected to the at least one guide rail through the rail coupling part.

In an embodiment, the at least one second clamp may be adjacent to the first clamp in a third direction intersecting each of the first direction and the second direction.

In an embodiment, the at least one rail coupling part may be alternately disposed with the at least one second clamp in the third direction.

In an embodiment, the at least one transfer robot may include a rail part extending in the first direction and a sliding part connected to the rail part and movable in the first direction and the second direction.

In an embodiment, the sliding part may include a sensor part that recognizes the plurality of probe blocks and a coupling part connected to the plurality of probe blocks.

In an embodiment, the at least one guide rail may include at least one first rail part connected to the at least one second clamp and at least one second rail part connected to the at least one rail coupling part.

In an embodiment, the at least one first rail part may be alternately disposed with the at least one second rail part in the third direction.

In an embodiment, the rail part may include a first area and a second area adjacent to the first area. The sliding part may include a first sliding part and a second sliding part. The first sliding part may be movable in the first direction and the second direction in the first area. The second sliding part may be movable in the first direction and the second direction in the second area.

In an embodiment, each of the plurality of probe blocks may include a probe pin that transmits a signal to an object to be inspected.

A display panel inspection method according to an embodiment of the disclosure includes connecting a transfer robot to one probe block among a plurality of probe blocks connected to a guide rail extending in a first direction, moving the probe block along the guide rail to a position by the transfer robot, fixing the probe block to the guide rail, and inspecting an object to be inspected by transmitting a signal to the object to be inspected through a probe pin included in the probe block.

In an embodiment, each of the plurality of probe blocks may include a first clamp. Each of the plurality of probe blocks may be connected to the transfer robot through the first clamp.

In an embodiment, each of the plurality of probe blocks may further include at least one second clamp. Each of the plurality of probe blocks may be fixed to the guide rail through the at least one second clamp.

In an embodiment, each of the plurality of probe blocks may further include at least one rail coupling part. Each of the plurality of probe blocks may be connected to the guide rail through the at least one rail coupling part.

In an embodiment, the at least one second clamp may be adjacent to the first clamp in a second direction intersecting the first direction, and the at least one rail coupling part may be alternately disposed with the at least one second clamp in the second direction.

In an embodiment, the transfer robot may include a rail part extending in the first direction and a sliding part connected to the rail part, movable in the first direction and a second direction opposite to the first direction, and connected to the probe block to move the probe block to the position.

In an embodiment, the guide rail may include at least one first rail part connected to the at least one second clamp and at least one second rail part connected to the at least one rail coupling part.

In an embodiment, the rail part may include a first area and a second area adjacent to the first area. The sliding part may include a first sliding part and a second sliding part. The first sliding part may be movable in the first direction and the second direction in the first area. The second sliding part may be movable in the first direction and the second direction in the second area.

In a display panel inspection device according to embodiments of the disclosure, the display panel inspection device may include a transfer robot and a guide rail respectively coupled to probe blocks. The transfer robot may move each of the probe blocks precisely to a predetermined position, and each of the probe blocks may be fixed to the guide rail at the predetermined position. As the transfer robot moves each of the probe blocks, a separate driver for moving each of the probe blocks may not be required. In addition, since a separate rack and pinion for moving each of the probe blocks may not be required, problems caused by the rack and pinion such as particle generation, contamination by lubricating oil, backlash, and the like may be improved. Accordingly, precision of inspection of a display panel may be increased and inspection process cost may be reduced, and thus inspection efficiency may be improved.

DETAILED DESCRIPTION OF THE EMBODIMENTS

Figure 1:
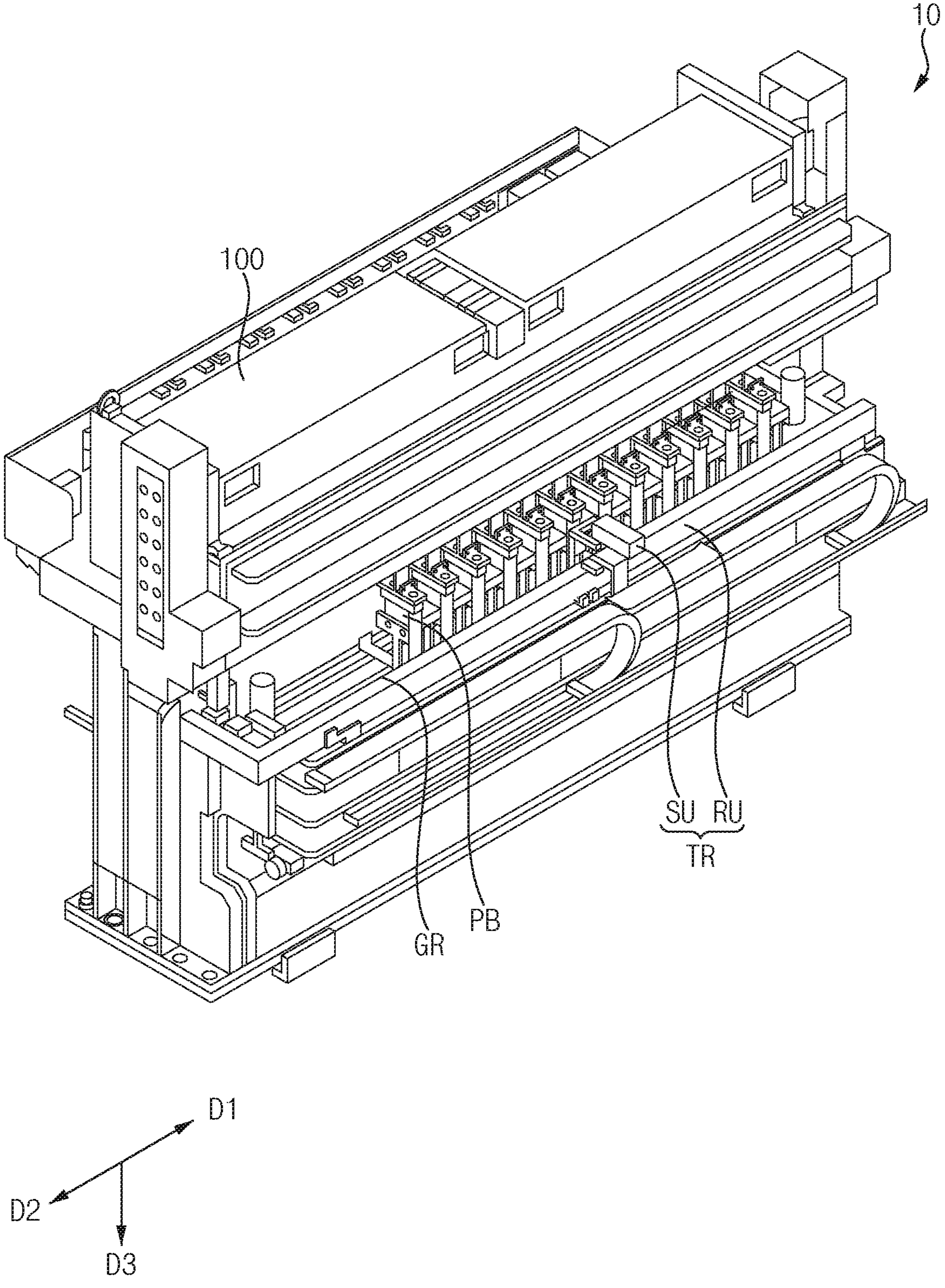
FIG. 1 is a schematic perspective view illustrating a display panel inspection device according to an embodiment of the disclosure.

Hereinafter, display devices in accordance with embodiments will be described in more detail with reference to the accompanying drawings. The same reference numerals are used for the same components in the drawings, and redundant descriptions of the same components will be omitted.

The term "and/or" includes all combinations of one or more of which associated configurations may define. For example, "A and/or B" may be understood to mean "A, B, or A and B."

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

FIG. 1 is a schematic perspective view illustrating a display panel inspection device according to an embodiment of the disclosure.

Referring to FIG. 1, a display panel inspection device 10 may include a body part 100, a transfer robot TR, a guide rail GR and/or probe blocks PB.

The body part 100 may have various structures. For example, as shown in FIG. 1, the body part 100 may extend in a first direction D1. The body part 100 may be formed of a rigid body which shape does not change.

The transfer robot TR may be disposed on at least a part of the body part 100. The transfer robot TR may be, for example, an encoder and/or motor. In an embodiment, the transfer robot TR may be a linear encoder. In another embodiment, the transfer robot TR may be an inchworm motor. However, the disclosure is not limited thereto.

In an embodiment, the transfer robot TR may include a rail unit (or rail part) RU and a sliding unit (or sliding part) SU connected to the rail unit RU.

The rail unit RU may have various structures. For example, as shown in FIG. 1, the rail unit RU may extend in the first direction D1. For example, the rail unit RU may extend in the first direction D1 along the body part 100. In an embodiment, the sliding unit SU may be movable in one or more directions, e.g., in the first direction D1 and a second direction D2 opposite to the first direction D1 along the rail unit RU. For example, the sliding unit SU may move in the first direction D1 or the second direction D2 along the rail unit RU.

The guide rail GR may be disposed on at least a part of the body part 100. For example, the guide rail GR may be disposed between the transfer robot TR and the probe blocks PB. The guide rail GR may extend in the first direction D1. For example, the guide rail GR may extend in the first direction D1 along the body part 100. In an embodiment, the guide rail GR may be an LM guide (Linear Motion Guide). However, the disclosure is not limited thereto.

The probe blocks PB may be coupled (or connected) to the guide rail GR. For example, the probe blocks PB may be coupled to the guide rail GR, and may be arranged in the first direction D1. In addition, the probe blocks PB may be coupled to the transfer robot TR. Specifically, one probe block PB among the probe blocks PB may be coupled to the sliding unit SU included in the transfer robot TR.

Accordingly, the probe blocks PB may be coupled to the transfer robot TR and movable in the first direction D1 and/or the second direction D2 along the guide rail GR. For example, the probe blocks PB may move in the first direction D1 or the second direction D2 along the guide rail GR. In other words, the probe blocks PB may be moved to a position (e.g., a predetermined or selectable position; hereinafter "predetermined position") along the guide rail GR by the transfer robot TR.

A position of each of the probe blocks PB moved by the transfer robot TR may be set according to a size or type of an object to be inspected. In other words, in case that the size or type of the object to be inspected is changed, the position of each of the probe blocks PB may be reset, and the transfer robot TR may move each of the probe blocks PB to the reset position. For example, the object to be inspected may be a display panel of a size of a mother glass.

Although FIG. 1 illustrates that the display panel inspection device 10 includes twelve (12) probe blocks PB, the disclosure is not limited thereto. In another example, the display panel inspection device 10 may include eleven (11) or less or thirteen (13) or more probe blocks PB.

Figure 2:
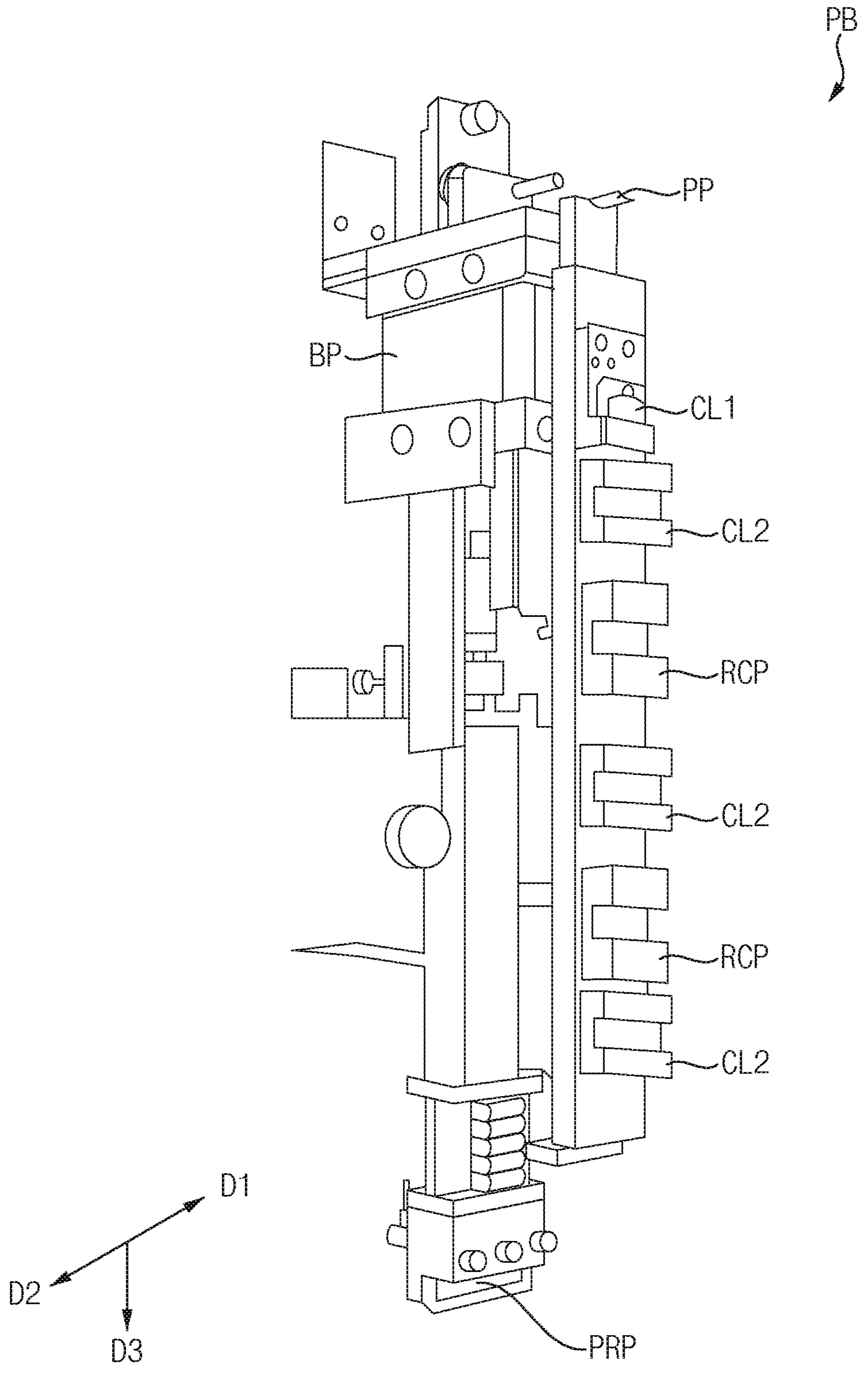
FIG. 2 is a schematic perspective view illustrating an example of a probe block included in the display panel inspection device of FIG. 1.

FIG. 2 is a schematic perspective view illustrating an example of a probe block included in the display panel inspection device of FIG. 1.

Referring to FIGS. 1 and 2, each of the probe blocks PB may include a body part BP, a protrusion part PP, a first clamp CL1, a second clamp CL2, a rail coupling part RCP and/or a probe pin PRP.

For example, each of the protrusion part PP, the first clamp CL1, the second clamp CL2, the rail coupling part RCP and the probe pin PRP may be disposed on at least a part of the body part BP.

The body part BP may extend in a third direction D3 intersecting each of the first direction D1 and the second direction D2. For example, the third direction D3 may be perpendicular to each of the first direction D1 and the second direction D2.

The protrusion part PP may be disposed on an upper part of the body part BP. The protrusion part PP may be a part recognized by the transfer robot TR.

The first clamp CL1 may be adjacent to the protrusion part PP in the third direction D3. The first clamp CL1 may be coupled to the transfer robot TR. Specifically, the first clamp CL1 may be coupled to the sliding unit SU included in the transfer robot TR. In an embodiment, the first clamp CL1 may be a datum clamp, but the disclosure is not limited thereto.

The second clamp CL2 may be adjacent to the first clamp CL1 in the third direction D3. The second clamp CL2 may be coupled to the guide rail GR. In addition, the second clamp CL2 may fix each of the probe blocks PB to the guide rail GR. For example, each of the probe blocks PB may be fixed to the guide rail GR through the second clamp CL2 at the predetermined position. In an embodiment, the second clamp CL2 may be an air clamp, but the disclosure is not limited thereto.

The rail coupling part RCP may be adjacent to the second clamp CL2. The rail coupling part RCP may be coupled to the guide rail GR. Each of the probe blocks PB may move to the predetermined position along the guide rail GR through the rail coupling part RCP.

In an embodiment, each of the second clamp CL2 and the rail coupling part RCP may be plural. In this case, the second clamp CL2 and the rail coupling part RCP may be alternately disposed in the third direction D3.

The probe pin PRP may be disposed on a lower part of the body part BP. The probe pin PRP may contact the object to be inspected. Specifically, the probe pin PRP may be electrically connected to the object to be inspected by contacting an electrode included in the object to be inspected.

The display panel inspection device 10 may inspect the object to be inspected by transmitting an electrical signal to the object to be inspected through the probe pin PRP. For example, the display panel inspection device 10 may inspect whether or not the object to be inspected is defective in driving, but the disclosure is not limited thereto.

Although FIG. 2 illustrates that each of the probe blocks PB includes three second clamps CL2 and two rail coupling parts RCP, the disclosure is not limited thereto. In another example, each of the probe blocks PB may include two or less or four or more second clamps CL2 and one or three or more rail coupling parts RCP.

Figure 3:
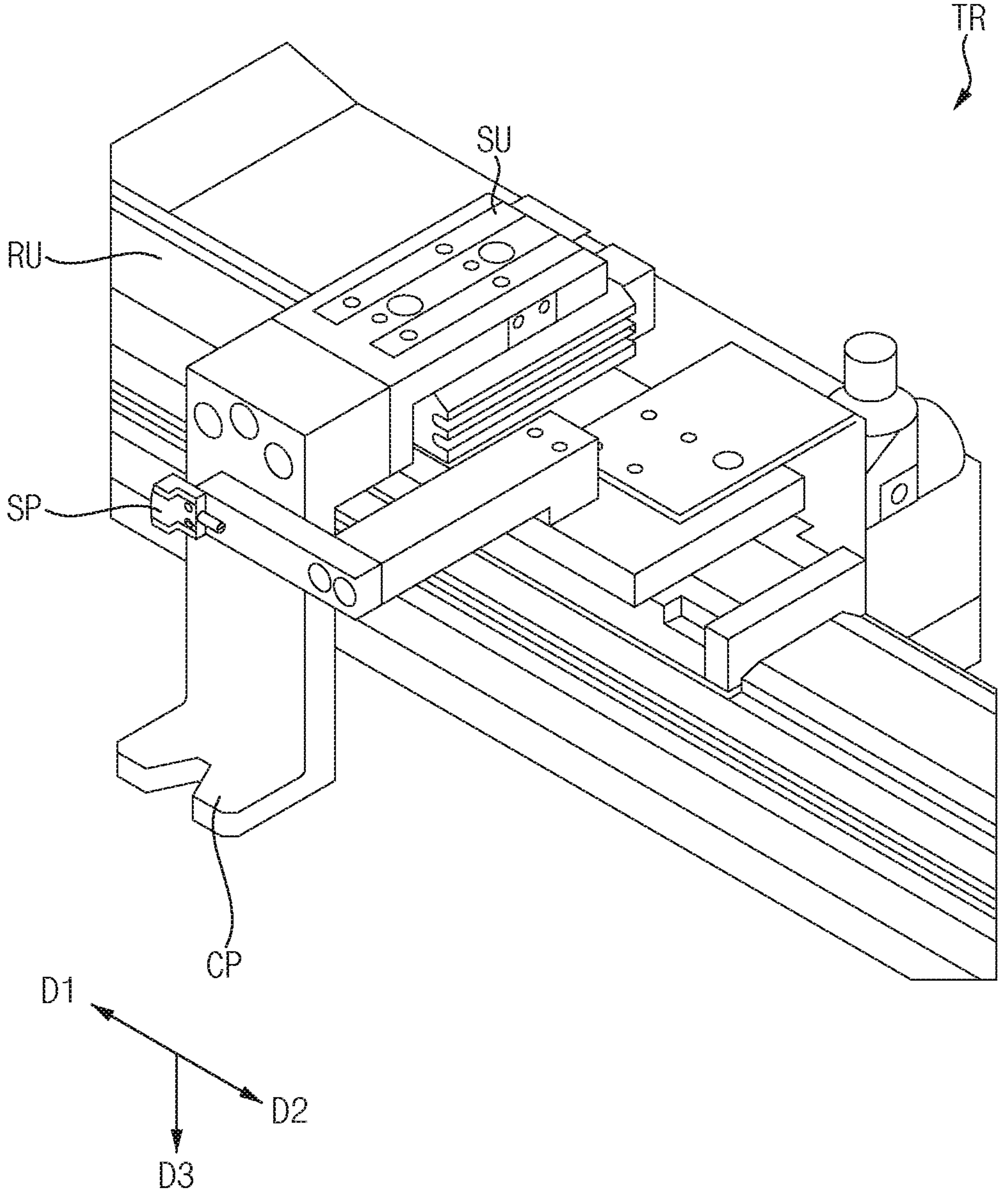
FIG. 3 is a schematic perspective view illustrating an example of a transfer robot included in the display panel inspection device of FIG. 1.

FIG. 3 is a schematic perspective view illustrating an example of a transfer robot included in the display panel inspection device of FIG. 1.

Referring to FIGS. 1, 2 and 3, the transfer robot TR may include the rail unit RU and the sliding unit SU. The sliding unit SU may include a sensor part SP and a coupling part CP adjacent to the sensor part SP.

The rail unit RU may extend in the first direction D1. In an embodiment, the sliding unit SU may be connected to the rail unit RU, and may be movable in the first direction D1 and the second direction D2. For example, the sliding unit SU may move in the first direction D1 or the second direction D2 along the rail unit RU.

The sensor part SP may recognize each of the probe blocks PB. Specifically, the sensor part SP may recognize the protrusion part PP included in each of the probe blocks PB. For example, the sensor part SP may recognize the protrusion part PP of the probe block PB to be moved to sense whether the probe block PB to be moved is close.

The coupling part CP may be adjacent to the sensor part SP in the third direction D3. The coupling part CP may be coupled to each of the probe blocks PB. Specifically, the coupling part CP may be coupled to the first clamp CL1 included in each of the probe blocks PB.

In other words, the sensor part SP may recognize a position of the probe block PB to be moved so that the coupling part CP may be coupled to the probe block PB. Accordingly, the transfer robot TR may move the probe block PB to the predetermined position.

Figure 4:
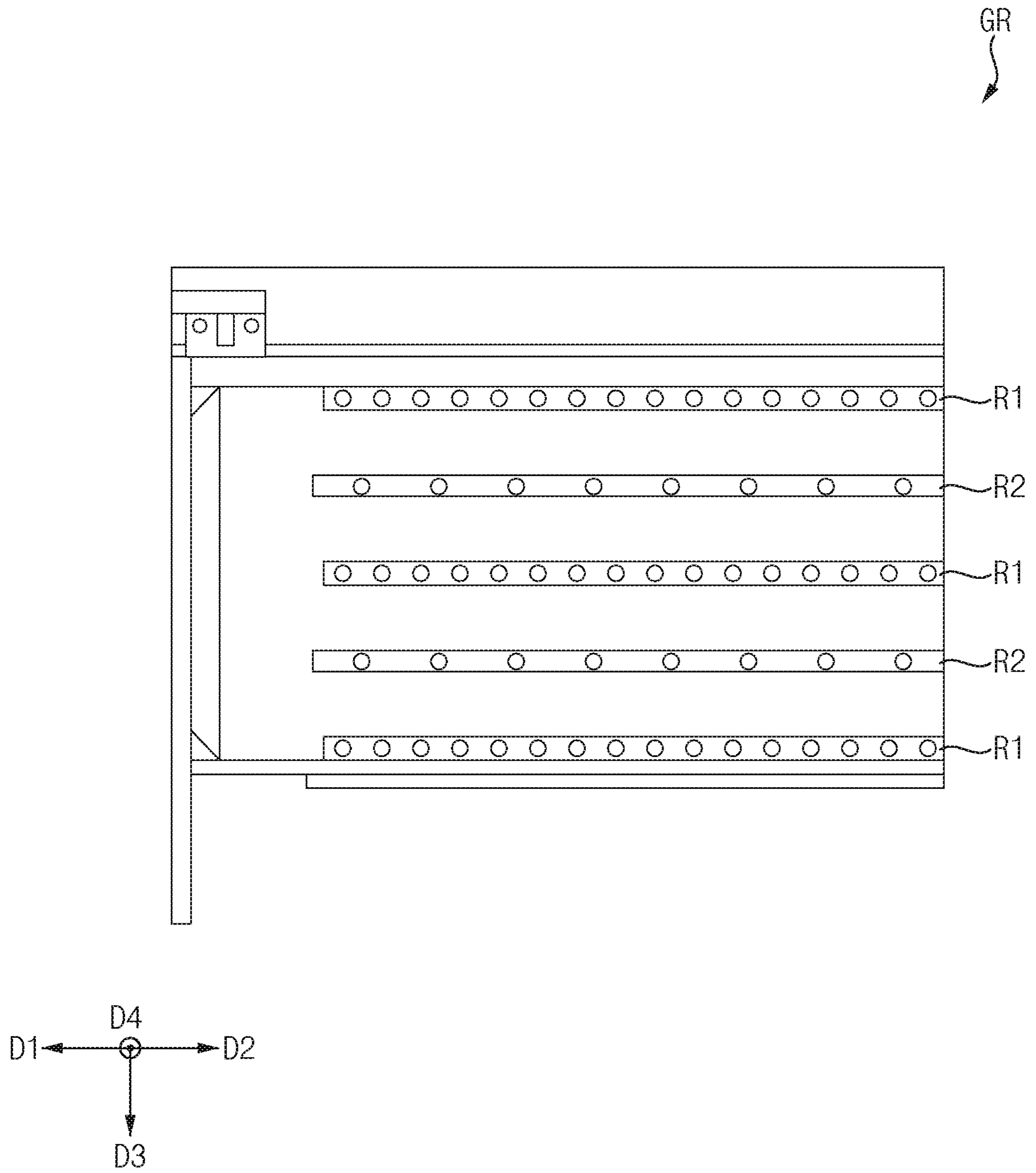
FIG. 4 is a schematic front view illustrating an example of a guide rail included in the display panel inspection device of FIG. 1.
Figure 5:
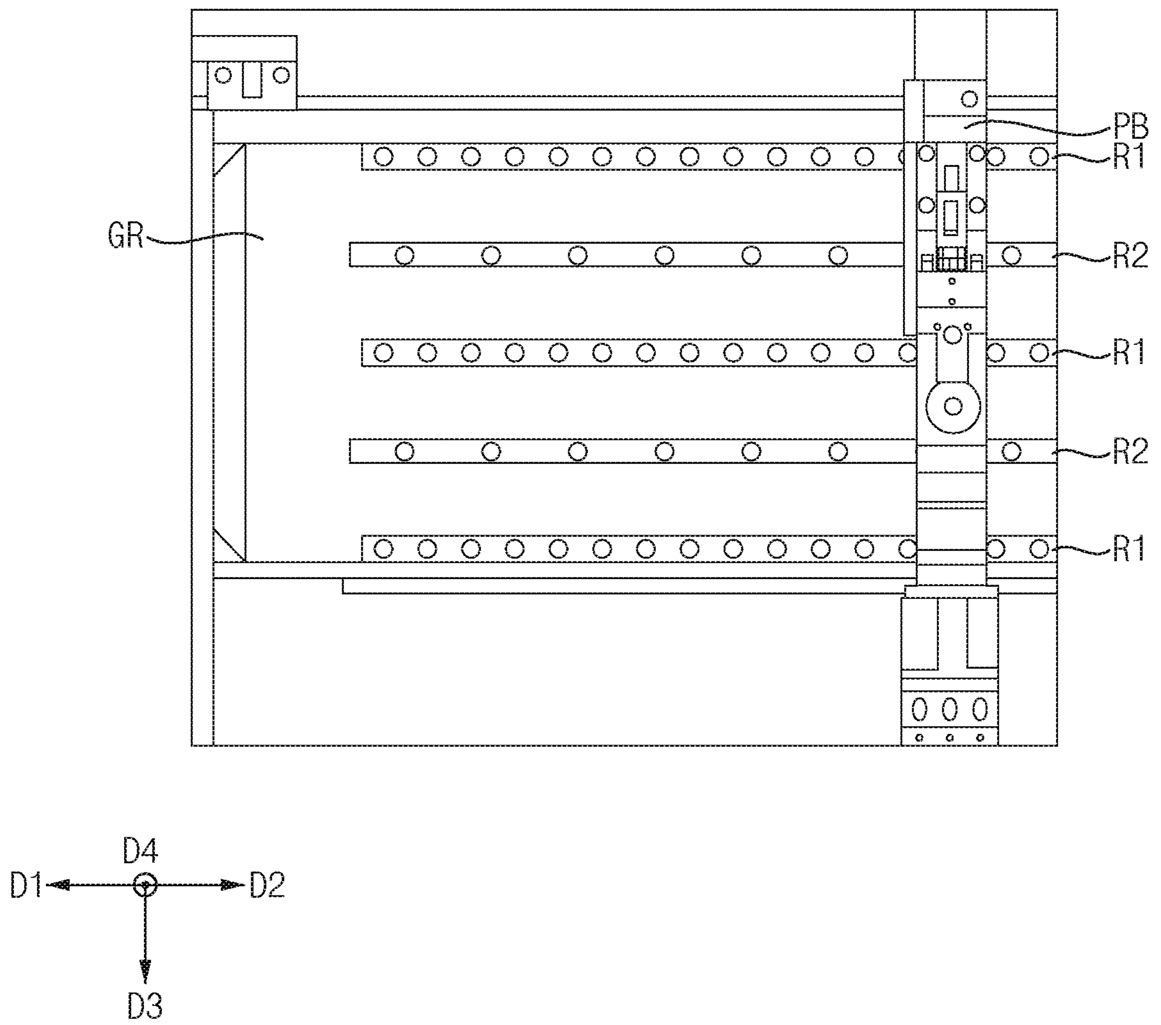
FIG. 5 is a schematic front view illustrating an example of a state in which the probe block is coupled to the guide rail of FIG. 4.

FIG. 4 is a schematic front view illustrating an example of a guide rail included in the display panel inspection device of FIG. 1. FIG. 5 is a front view illustrating an example of a state in which the probe block is coupled to the guide rail of FIG. 4.

Referring to FIGS. 1, 2, 3, 4 and 5, the guide rail GR may include a first rail part R1 and a second rail part R2 adjacent to the first rail part R1.

The guide rail GR may extend in the first direction D1, and may be coupled to the probe blocks PB.

The first rail part R1 may extend in the first direction D1. The first rail part R1 may protrude in a fourth direction D4 intersecting each of the first direction D1, the second direction D2 and the third direction D3. For example, the fourth direction D4 may be perpendicular to each of the first direction D1, the second direction D2 and the third direction D3. The first rail part R1 may be coupled to the second clamp CL2 protruding in a direction opposite to the fourth direction D4. For example, in case that each of the probe blocks PB is moved to the predetermined position, the second clamp CL2 may clamp the first rail part R1 to fix each of the probe blocks PB to the guide rail GR.

The second rail part R2 may extend in the first direction D1. The second rail part R2 may protrude in the fourth direction D4. The second rail part R2 may be coupled to the rail coupling part RCP protruding in the direction opposite to the fourth direction D4. For example, the rail coupling part RCP may be coupled to the second rail part R2, and each of the probe blocks PB may be moved to the predetermined position along the guide rail GR.

In an embodiment, each of the first rail part R1 and the second rail part R2 may be plural. In this case, the first rail part R1 and the second rail part R2 may be alternately disposed in the third direction D3.

The display panel inspection device 10 according to an embodiment of the disclosure may include the transfer robot TR and the guide rail GR respectively coupled to the probe blocks PB. The transfer robot TR may move each of the probe blocks PB precisely to the predetermined position, and each of the probe blocks PB may be fixed to the guide rail GR at the predetermined position. As the transfer robot TR moves each of the probe blocks PB, a separate driver for moving each of the probe blocks PB may not be required. In addition, since a separate rack and pinion may not be required, problems caused by the rack and pinion such as particle generation, contamination by lubricating oil, backlash, and the like may be improved. Accordingly, precision of inspection of a display panel may be increased and inspection process cost may be reduced, and thus inspection efficiency may be improved.

Figure 6:
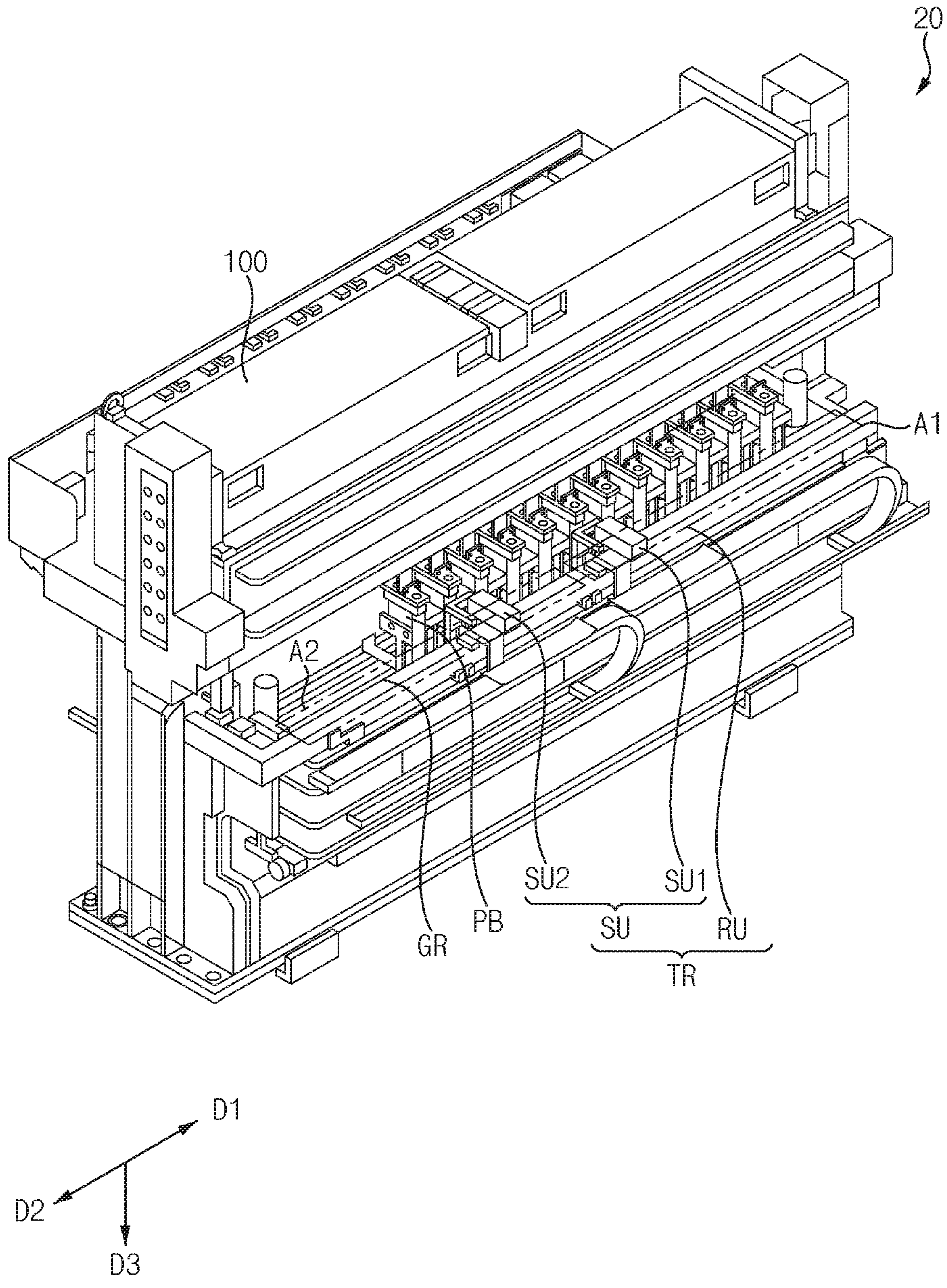
FIG. 6 is a schematic perspective view illustrating a display panel inspection device according to another embodiment of the disclosure.

FIG. 6 is a schematic perspective view illustrating a display panel inspection device according to another embodiment of the disclosure.

Referring to FIG. 6, a display panel inspection device 20 may include a body part 100, a transfer robot TR, a guide rail GR and/or probe blocks PB.

Hereinafter, descriptions overlapping with those of the display panel inspection device 10 described with reference to FIGS. 1, 2, 3, 4 and 5 will be omitted or simplified.

The transfer robot TR may be disposed on a part of the body part 100. In an embodiment, the transfer robot TR may include the rail unit RU and the sliding unit SU connected to the rail unit RU.

The rail unit RU may extend in the first direction D1. The rail unit RU may include a first area A1 and a second area A2 adjacent to the first area A1. The sliding unit SU may be movable in the first direction D1 and the second direction D2 along the rail unit RU.

The sliding unit SU may include a first sliding unit SU1 and a second sliding unit SU2. In an embodiment, the first sliding unit SU1 and the second sliding unit SU2 may move without interfering with each other. For example, the first sliding unit SU1 may be movable in the first direction D1 and/or the second direction D2 in the first area A1, and the second sliding unit SU2 may be movable in the first direction D1 and/or the second direction D2 in the second area A2. For example, the first sliding unit SU1 may move in the first direction D1 or the second direction D2 in the first area A1, and the second sliding unit SU2 may move in the first direction D1 or the second direction D2 in the second area A2.

In other words, the first sliding unit SU1 may move each of the probe blocks PB to the predetermined position in the first area A1 of the rail unit RU, and the second sliding unit SU2 may move each of the probe blocks PB to the predetermined position in the second area A2 of the rail unit RU.

Although FIG. 6 illustrates that the transfer robot TR includes two sliding units SU1 and SU2, the disclosure is not limited thereto. In another example, the transfer robot TR may include three or more sliding units.

In addition, although FIG. 6 illustrates that the first sliding unit SU1 and the second sliding unit SU2 move on one rail unit RU, the disclosure is not limited thereto. In another example, the first sliding unit SU1 and the second sliding unit SU2 may move on different rail units.

The display panel inspection device 20 according to another embodiment of the disclosure may include the transfer robot TR including the rail unit RU and the first and second sliding units SU1 and SU2. The first sliding unit SU1 may move the probe blocks PB in the first area A1 of the rail unit RU, and the second sliding unit SU2 may move the probe blocks PB in the second area A2 of the rail unit RU. Accordingly, in case that the object to be inspected is changed and positions of the probe blocks PB need to be changed, the probe blocks PB may be moved relatively quickly. Accordingly, time of the inspection process for the display panel may be shortened and inspection efficiency may be improved.

The disclosure can be applied to a display panel inspection device of various display devices. For example, the disclosure is applicable to a display panel inspection device of various display devices such as display devices for vehicles, ships and aircraft, portable communication devices, display devices for exhibition or information transmission, medical display devices, and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A display panel inspection device comprising:
a body part extending in a first direction;
at least one guide rail disposed on a part of the body part and extending in the first direction;
a plurality of probe blocks connected to the at least one guide rail, movable along the at least one guide rail, and arranged in the first direction; and
at least one transfer robot connected to one probe block among the plurality of probe blocks, and
wherein the at least one transfer robot comprises:
a motor, and
a movable structure movable in the first direction and a second direction opposite to the first direction.

2. The display panel inspection device of claim 1, wherein
each of the plurality of probe blocks includes a first clamp, and
each of the plurality of probe blocks is connected to the at least one transfer robot through the first clamp.

3. The display panel inspection device of claim 2, wherein
each of the plurality of probe blocks further includes at least one second clamp, and
each of the plurality of probe blocks is fixed to the at least one guide rail through the at least one second clamp.

4. The display panel inspection device of claim 3, wherein
each of the plurality of probe blocks further includes at least one rail coupling part, and
each of the plurality of probe blocks is connected to the at least one guide rail through the at least one rail coupling part.

5. A display panel inspection device comprising:
a body part extending in a first direction;
at least one guide rail disposed on a part of the body part and extending in the first direction;
a plurality of probe blocks connected to the at least one guide rail, movable along the at least one guide rail, and arranged in the first direction; and
at least one transfer robot connected to one probe block among the plurality of probe blocks and movable in the first direction and a second direction opposite to the first direction,
each of the plurality of probe blocks includes a first clamp, each of the plurality of probe blocks is connected to the at least one transfer robot through the first clamp, each of the plurality of probe blocks further includes at least one second clamp, each of the plurality of probe blocks is fixed to the at least one guide rail through the at least one second clamp, each of the plurality of probe blocks further includes at least one rail coupling part, each of the plurality of probe blocks is connected to the at least one guide rail through the at least one rail coupling part, and wherein the at least one second clamp is adjacent to the first clamp in a third direction intersecting each of the first direction and the second direction.

6. The display panel inspection device of claim 5, wherein the at least one rail coupling part is alternately disposed with the at least one second clamp in the third direction.

7. The display panel inspection device of claim 1, wherein the at least one transfer robot includes a rail part extending in the first direction, and wherein the movable structure is a sliding part connected to the rail part and movable in the first direction and the second direction.

8. The display panel inspection device of claim 7, wherein the sliding part includes:

a sensor part that recognizes the plurality of probe blocks; and a coupling part connected to the plurality of probe blocks.

9. The display panel inspection device of claim 5, wherein the at least one guide rail includes:

at least one first rail part connected to the at least one second clamp; and at least one second rail part connected to the at least one rail coupling part.

10. The display panel inspection device of claim 9, wherein the at least one first rail part is alternately disposed with the at least one second rail part in the third direction.

11. The display panel inspection device of claim 7, wherein the rail part includes a first area and a second area adjacent to the first area, the sliding part includes a first sliding part and a second sliding part, the first sliding part is movable in the first direction and the second direction in the first area, and the second sliding part is movable in the first direction and the second direction in the second area.

12. The display panel inspection device of claim 1, wherein each of the plurality of probe blocks includes a probe pin that transmits a signal to an object to be inspected.

13. A display panel inspection method comprising:

connecting a transfer robot comprising a motor to one probe block among a plurality of probe blocks connected to a guide rail extending in a first direction;

moving the probe block along the guide rail to a position by the transfer robot;

fixing the probe block to the guide rail; and inspecting an object to be inspected by transmitting a signal to the object to be inspected through a probe pin included in the probe block.

14. The display panel inspection method of claim 13, wherein each of the plurality of probe blocks includes a first clamp, and each of the plurality of probe blocks is connected to the transfer robot through the first clamp.

15. The display panel inspection method of claim 14, wherein each of the plurality of probe blocks further includes at least one second clamp, and each of the plurality of probe blocks is fixed to the guide rail through the at least one second clamp.

16. The display panel inspection method of claim 15, wherein each of the plurality of probe blocks further includes at least one rail coupling part, and each of the plurality of probe blocks is connected to the guide rail through the at least one rail coupling part.

17. The display panel inspection method of claim 16, wherein the at least one second clamp is adjacent to the first clamp in a second direction intersecting the first direction, and the at least one rail coupling part is alternately disposed with the at least one second clamp in the second direction.

18. The display panel inspection method of claim 13, wherein the transfer robot includes:

a rail part extending in the first direction; and a sliding part connected to the rail part, movable in the first direction and a second direction opposite to the first direction, and connected to the probe block to move the probe block to the position.

19. The display panel inspection method of claim 17, wherein the guide rail includes:

at least one first rail part connected to the at least one second clamp; and at least one second rail part connected to the at least one rail coupling part.

20. The display panel inspection method of claim 18, wherein the rail part includes a first area and a second area adjacent to the first area, the sliding part includes a first sliding part and a second sliding part, the first sliding part is movable in the first direction and the second direction in the first area, and the second sliding part is movable in the first direction and the second direction in the second area.

* * * * *